United States Patent
Kordts et al.

[11] Patent Number: 6,005,792
[45] Date of Patent: Dec. 21, 1999

[54] CIRCUIT ARRANGEMENT FOR A MEMORY CELL OF A D/A CONVERTER

[75] Inventors: Jürgen Kordts, Buxtehude; Friedrich Hahn, Schenefeld; Peter Rolla, Hamburg; Ralf Beier, Hamburg; Axel Näthe, Hamburg, all of Germany

[73] Assignee: U.S. Philips Corporation, New York, N.Y.

[21] Appl. No.: 08/988,593

[22] Filed: Dec. 11, 1997

[30] Foreign Application Priority Data

Dec. 13, 1996 [DE] Germany .................. 196 51 921

[51] Int. Cl.$^6$ .................................................. G11C 11/00
[52] U.S. Cl. ........................................ 365/154; 341/144
[58] Field of Search ............................ 365/154; 341/144

[56] References Cited

U.S. PATENT DOCUMENTS

5,321,401   6/1994   White ........................................ 341/144

*Primary Examiner*—David Nelms
*Assistant Examiner*—Anh Phung
*Attorney, Agent, or Firm*—Steven R. Biren

[57] ABSTRACT

The binary values of the data word to be converted in a widely used type of D/A converter are supplied to a series of stages in which binarily stepped currents are supplied to a common output or derived therefrom, or are conducted to a second common output. To control the current switch, each stage comprises a flipflop in which the binary value to be converted is stored. Integration processes are often used in the integration of analog circuits by means of which digital circuit components cannot be usefully realized, for example, in the IIL technology. In the flipflop comprising cross-coupled transistors, the emitters are connected to a reference voltage which lies between ground potential and the supply voltage so as to obtain a favorable conversion of the digital signals for triggering the current switch. This renders it possible to connect the collectors of the transistors of the flipflop directly to the bases of the current switch. In addition, the control of the flipflop is simplified thereby, and the delay time is shortened.

7 Claims, 6 Drawing Sheets

CIRCUIT ARRANGEMENT FOR A MEMORY CELL OF A D/A CONVERTER

BACKGROUND OF THE INVENTION

The invention relates to a circuit arrangement for a memory cell of a D/A converter, and in particular to a memory cell in which an analog current is switched by means of a stored digital signal.

Figure 1:
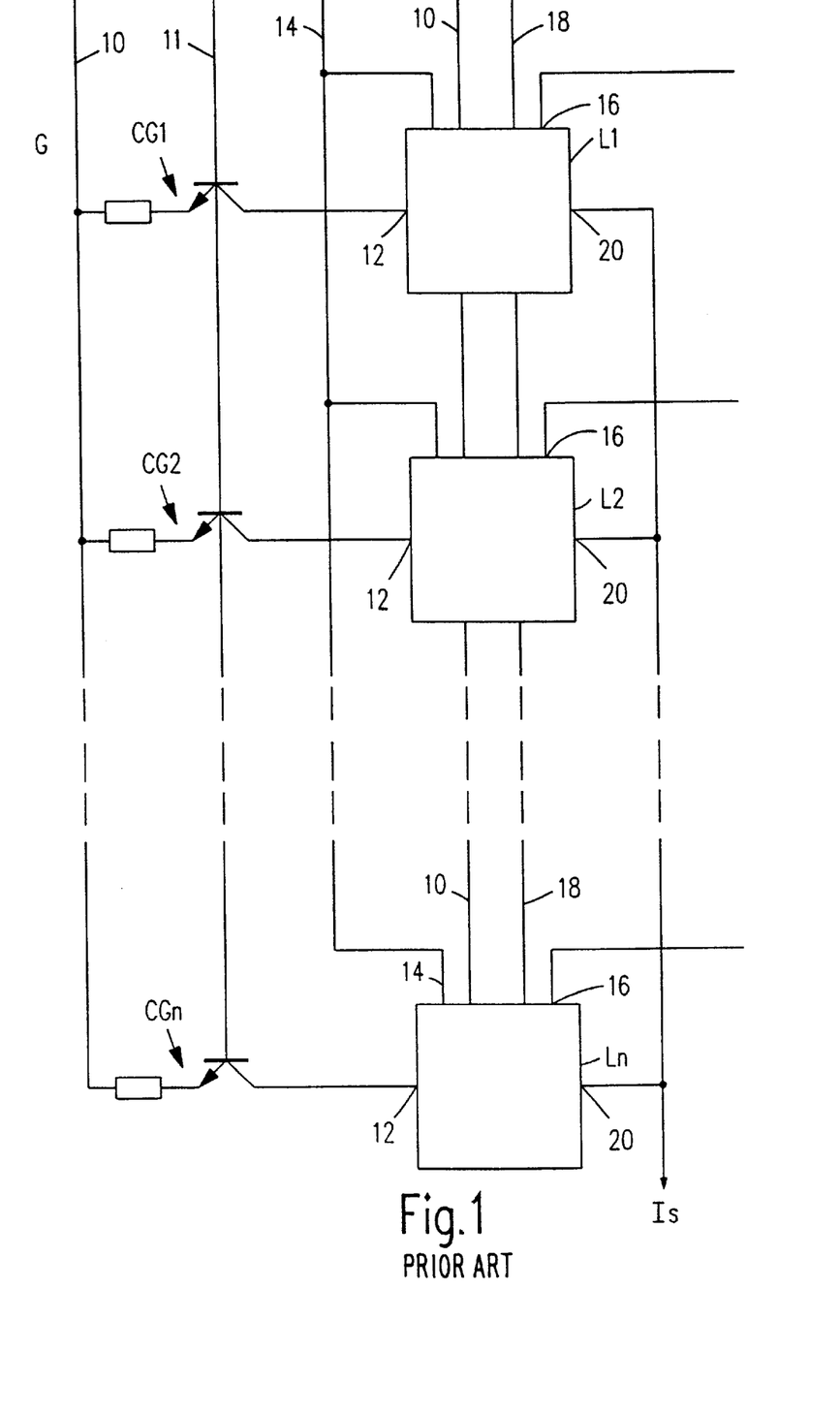
FIG. 1 shows a prior-art D/A converter.

A widely used kind of D/A converter comprises a number of stages to which currents with binarily graded values are supplied by current generators, and this supplied current is passed on to an output or derived therefrom, or passed on to another output in dependence on a binary value stored in the relevant stage each time. An example of such a D/A converter is shown in FIG. 1 and comprises a number of stages L1, L2 . . . Ln, as well as a number of current generators CG1, CG2 . . . CGn. Each current generator comprises a series arrangement of a resistor and a transistor, one end of the resistor being connected to a line 10 for a reference voltage, i.e. in general ground, while the bases of all transistors are connected to a line 11 for receiving an auxiliary voltage. The resistors are so dimensioned that a current will flow in the collector of the transistor of a given current generator which has double the value of the current flowing in the preceding current generator. These currents are supplied to a current input 12 of a relevant stage L1, L2 . . . Ln, which delivers this current to a current output 20 in dependence on a digital value stored in this stage, all current outputs being interconnected, and thus supplying a summed current Is. The binary values stored in the individual stages are supplied in advance via a data input 16 and written into the stages by means of a signal on a control line 14.

If such a D/A converter is to be integrated together with further analog circuits in a semiconductor, a manufacturing process will often be used for this in which only analog circuits can be usefully manufactured, but no digital circuits, so that digital circuits are to be realized by analog means. This is true in particular when the integration technology used does not allow the manufacture of circuits in accordance with the IIL-technology.

Figure 2:
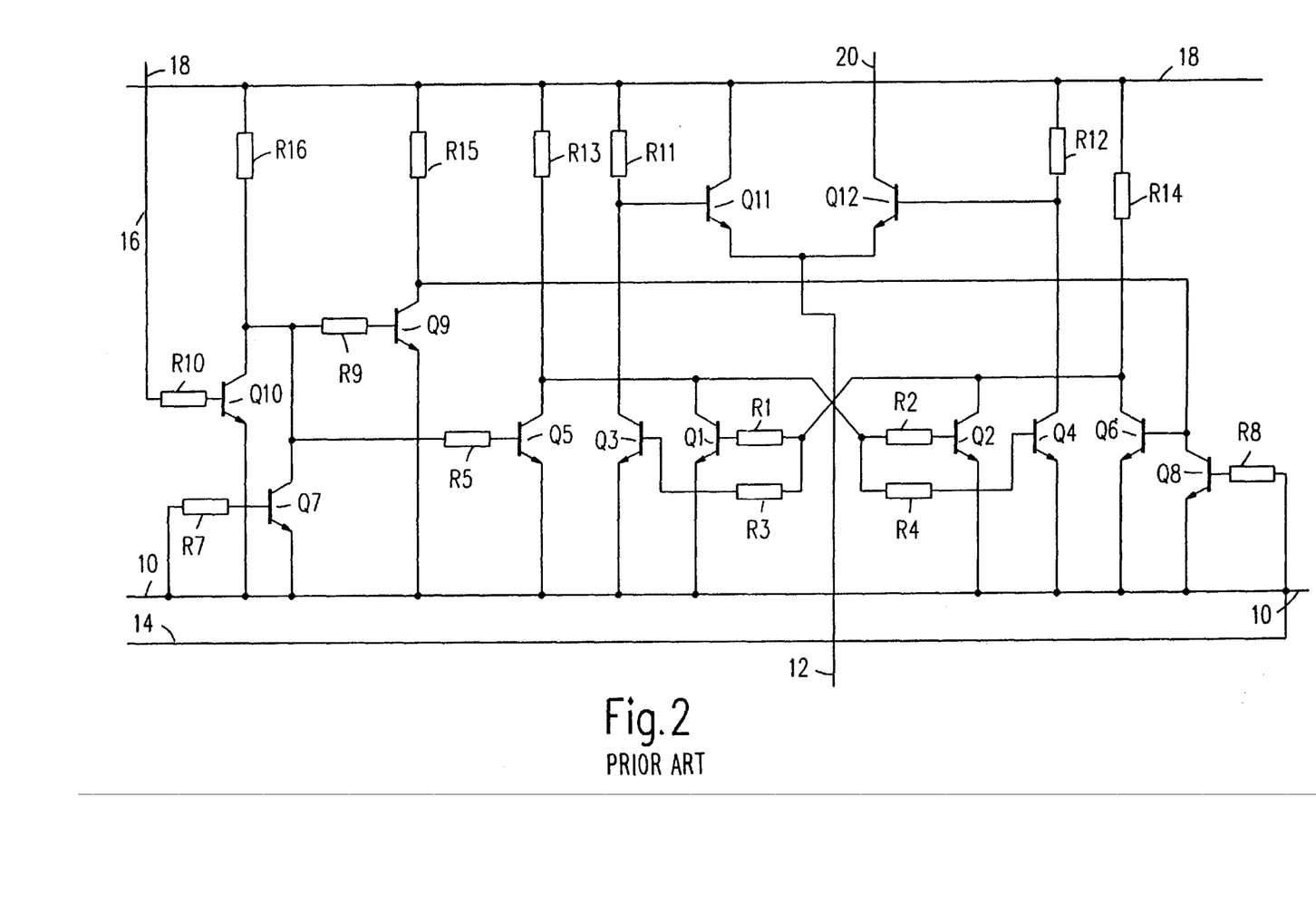
FIG. 2 shows a memory cell circuit for use in a D/A converter.

FIG. 2 shows a circuit arrangement for a memory cell of a D/A converter corresponding to one of the stages L1, L2, etc. in FIG. 1, constructed in a conventional analog technology. The analog current supplied to a current input 12 is conducted to the emitters of two transistors Q11 ad Q12 whose bases are controlled with different voltages so that the supplied current is either fully delivered through the output 20 or is removed through a line 18 connected to the operating voltage. The transistors Q11 and Q12 thus act as a switch which is controlled by a flipflop formed by transistors Q1 and Q2, which are cross-coupled, i.e. the base of each of these transistors is connected to the collector of the other transistor via a respective resistor R1, R2.

The transistors Q11 and Q12 forming the switch are controlled by the transistors Q3 and Q4, respectively, connected in parallel to the transistors Q1 and Q2 via the respective resistors R3 and R4, and by the resistors R11 and R12 connected to the collectors of Q3 and Q4. Resistors are always necessary in the base lines in the case of parallel-connected base connections for reasons of current division. The flipflop is supplied with current via the resistors R14 and R15 which are connected to the line 18 for the supply voltage. Transistors Q5 and Q6, by means of which the binary value can be set in the flipflop, are connected in parallel to the transistors Q1 and Q2 of the flipflop. For this purpose, the base of the transistor Q5 is connected via a resistor R5 to the collectors of two further transistors Q7 and Q10 which are connected via a further resistor R9 to a further transistor Q9 and via a resistor R16 to the line 18. The collector of the transistor Q9 is connected via a resistor R15 to the line 18 and also to the base of the transistor Q6 and the collector of a transistor Q8. The bases of the transistors Q7 and Q8 are connected to the control input 14 via respective resistors R7 and R8, and the transistor Q10 is connected to the data input 16 via a resistor R10. As long as the control input 14 is at a high potential, the transistors Q7 and Q8 are conducting, and the transistors Q5 and Q6 are accordingly cut off, so that the state of the flipflop is not affected. When the control input 14 is at a low potential, the transistors Q7 and Q8 are cut off, and the transistor Q9 or Q10 is cut off in dependence on the signal at the data input 16, and the transistor Q5 or Q6 is accordingly conducting, with the result that the flipflop is set for the binary value applied to the data input 16.

It is a disadvantage of this circuit that many components are required and that the integration requires much surface space, because the transistors must be realized in separate islands. Furthermore, the delay times in this circuit are not ideal because two transistor delay periods, i.e. those of the transistors Q7 and Q5 or Q8 and Q6, are required for activating the control input 14 each time before the state of the flipflop with the transistors Q1 and Q2 is changed. It is also a disadvantage that all supply currents in the circuit remain unchanged during the period in which the control input is at a high potential and accordingly no write action takes place, so that the current consumption is comparatively high.

SUMMARY OF THE INVENTION

It is an object of the invention to provide a circuit arrangement for a memory cell of a D/A converter which is of a simple construction and has a short delay time while an integration technique for analog circuits is used.

This object is essentially achieved in that the emitters of the transistors forming the flipflop are not connected to the reference voltage of the overall circuit, i.e. ground, but to a somewhat higher further reference voltage whose minimum value depends on a limit voltage of the associated current generator. This renders it possible to construct at least one cross-coupling between the transistors forming the flipflop in a direct manner, i.e. without a resistor, and the collectors of the transistors forming the flipflop can be directly connected to the bases of the transistors which form the current switch. In addition, the data signal and the control signal can be supplied to at least one, preferably by two control transistors whose collectors are directly connected to the bases of the transistors forming the flipflop. As a result, the number of transistors required is only small, and only very few resistors, only one resistor in the extreme case, are required, so that the circuit arrangement according to the invention requires only a small integration area and has only a short delay period on account of the small number of directly coupled transistors.

BRIEF DESCRIPTION OF THE DRAWING

Embodiments of the invention will be explained in more detail below with reference to the drawing, in which.

DESCRIPTION OF THE PREFERRED EMBODIMENTS

Figure 3:
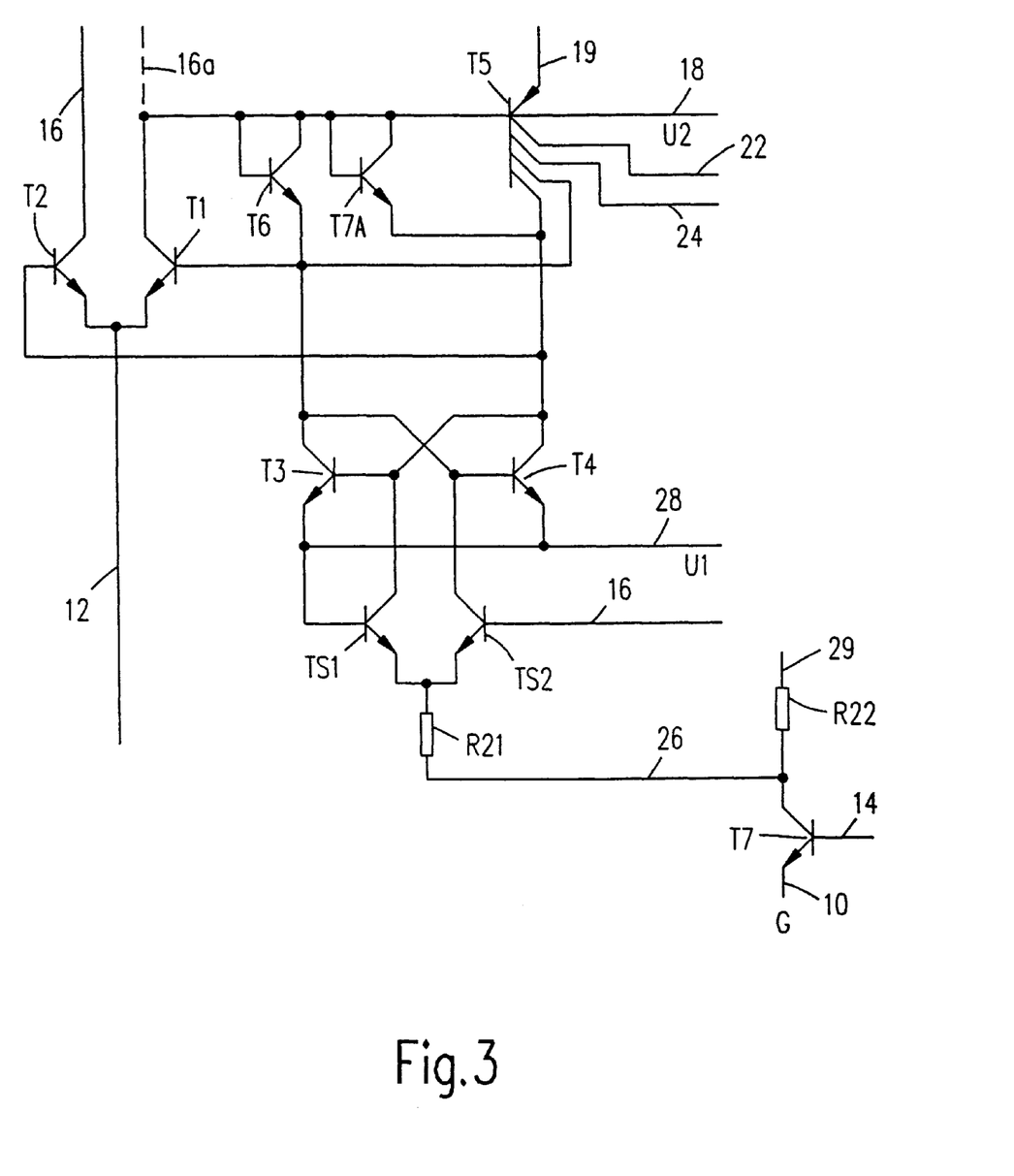
FIG. 3 shows a circuit arrangement according to the invention with two control transistors, FIG. 4 diagrammatically shows the lay-out of three circuit arrangements of FIG. 3 arranged side by side.

In FIG. 3, two transistors T1 and T2 are provided again for switching a current supplied to the current input 12, the current to be switched being applied to the emitters thereof, while the collector of transistor T2 forms the current output 16. The collector of the transistor T1 is connected to the line 18 for the operating voltage in the ensuing description. The flipflop is again formed here by two cross-coupled transistors T3 and T4, the base of each transistor being directly connected to the collector of the respective other transistor. The current supply of the flipflop takes place from two current sources which are formed by the collectors of a multi-collector transistor T5 whose conductivity type is opposed to that of the transistors T3 and T4 of the flipflop, i.e. a PNP transistor in the present example. The transistor T5 comprises two further collectors from which currents are derived for the flipflop of an adjoining circuit arrangement via respective lines 22 and 24. This has advantages for the integration, as will be explained further below.

In contrast to the circuit of FIG. 2, the emitters of the transistors T3 and T4 forming the flipflop are not connected to ground, but are connected to a higher reference voltage U1 via a line 28, which voltage preferably lies between 1 and 1.5 V. It is possible in this manner to connect the bases of the transistors T1 and T2 of the current switch directly to the collectors of the transistors T3 and T4 which form the flipflop. It is essential for the transistor of the current generator CG shown in FIG. 1 to receive a sufficiently high collector-emitter voltage Uce in both states of the flipflop. If it is assumed that the line 11 shown in FIG. 1 as connected to the base of the transistor in the current generator has a voltage of 1 V, so that a voltage of approximately 0,3 V arises at the emitter resistor of the current generator, and that the collector-base voltage of the transistor in the current generator must be higher than zero, then the reference voltage U1 on the line 28 applied to the emitters of the transistors T3 and T4 must be above 1V. Now if the transistor T2 is conducting, for example, its base, and accordingly also the base of the transistor T3, has a potential which is higher than 1 V by a base-emitter forward voltage. The emitter of the transistor T3, and accordingly the reference voltage U1, must be at least 1 V then. Taking into account tolerances, the reference voltage U1 is suitably chosen to lie between 1.2 and 1.5 V.

Since the emitters of the transistors T3 and T4 are at the reference voltage U1, which is higher than the ground potential, it is possible to use a simple differential amplifier circuit with the control transistors TS1 and TS2 for writing a binary value into the flipflop, the emitters of TS1 and TS2 being jointly connected to a control line 26 via a resistor R21. This control line 26 is controlled jointly with the control lines of all other stages by the collector of a transistor T7 whose emitter is connected to ground and whose base is connected to the control line 14. When the transistor T7 is cut off, and accordingly the voltage at the control line 26 is higher than the reference voltage U1, no current will flow through the control transistors TS1 and TS2 and the state of the flipflop is not influenced. The transistor T7 is switched into conduction for the purpose of writing a binary value determined by the signal at the data input 16, and either the transistor TS1 or the transistor TS2 is conducting, and the transistor T3 or T4 is cut off, in dependence on the signal at the data input 16. The collector current of the relevant transistor TS1 or TS2 must then be approximately two or three times higher than the current supplied by the corresponding collector of the transistor T5. If, for example, the transistor TS1 is conducting, the transistor T3 is cut off, because the collector current of the transistor TS1 is greater than the collector current of the transistor T5. The transistor T7A connected as a diode achieves that the base of the transistor T3 is brought to approximately the reference voltage U1, because the collector and base of the transistor T7A are connected to the operating voltage U2, which here has the value U2=U1+Ube. It is prevented thereby that the transistor TS1 becomes saturated, in which case an inadmissibly high base current could flow. A similar situation arises when the signal at the data input 16 is higher than the reference voltage U1, so that the transistor TS2 is conducting. Here the potential at the collector of the transistor TS2 is limited by the transistor T6 connected as a diode.

In the storage phase following the writing phase, when the transistor T7A is cut off, only a very small leakage current will flow through the transistors T6 and T7A. This is achieved in that the operating voltage U2 is higher than the reference voltage U1 by no more than Ube, so that at most the voltage Uce=Ube−Ucesat is applied to the transistors T6 and T7A. Only these two currents are required for the transistors T3 and T4 during the storage phase, whereas a current which is two or three times higher has to be additionally drawn from the operating voltage U2 for the short storage input process only. The operating voltage U2 and the reference voltage U1 are to be generated only once for all memory cells. The emitters of the transistors T5 of all memory cells may in principle also be connected to one common current source.

Figure 4:
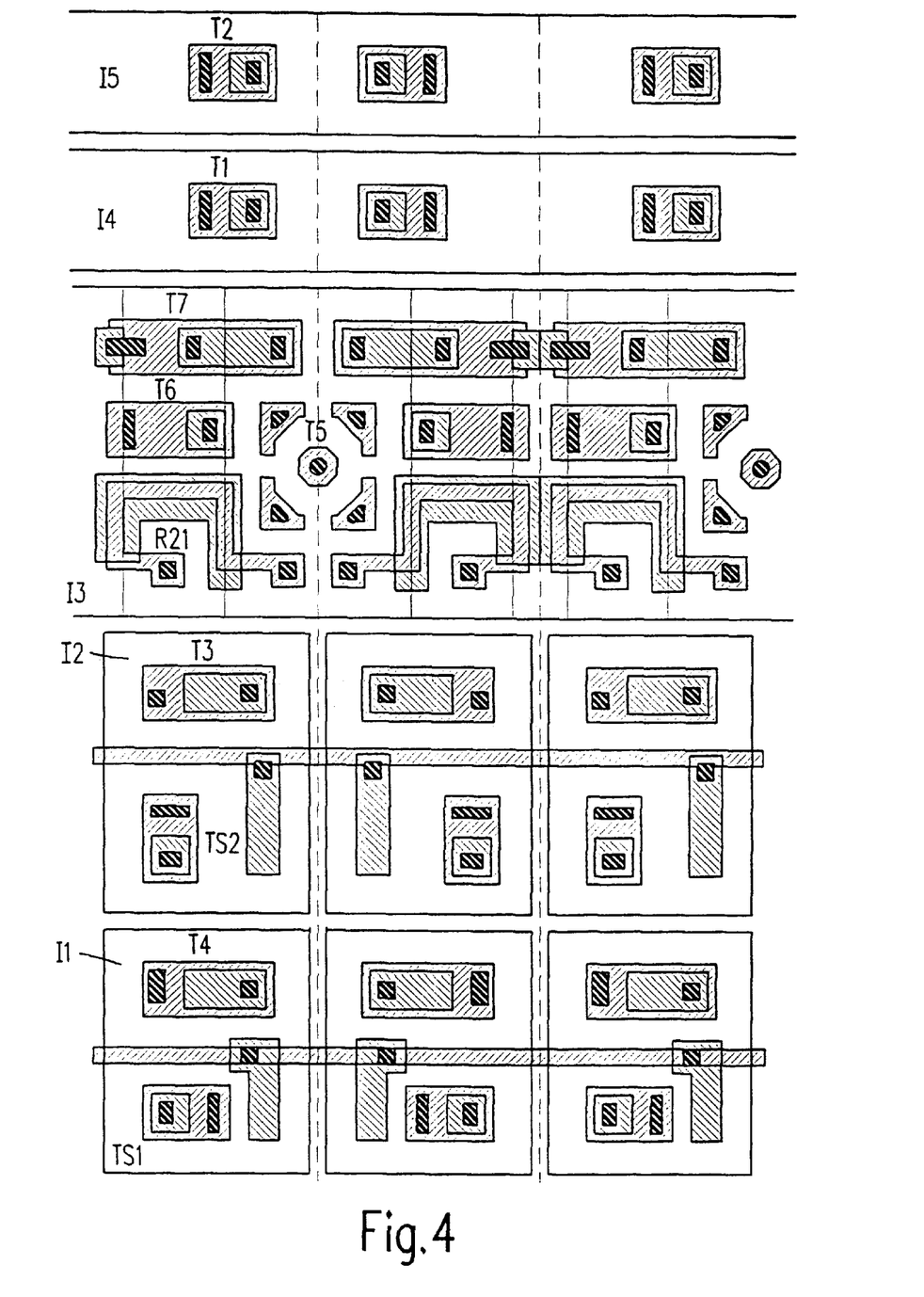

The circuit of FIG. 3 is advantageous in particular on account of its integration on a small surface area, because only few components are necessary and in addition several components can be integrated in a common island. FIG. 4 diagrammatically shows an example for a layout with three circuit arrangements according to FIG. 3 next to one another, without wiring levels being shown. The transistor T5 is a lateral PNP transistor with four separate collectors, which provides the current supply to two circuits. Two circuits in a mutually mirrored arrangement are accordingly connected to one transistor T5 each time. In the same island I3, furthermore, the transistors T6 and T7A serving as diodes and the resistor R3 are also accommodated. This island I3 may in principle be merged with the relevant corresponding islands of all other circuits. The transistor T1 is present in a separate island I4 together with the relevant other transistors T1 of the other circuits. This island I4 could alternatively be merged with the island I3 comprising the transistors T5, T6 and T7A if the collector of the transistor T1 is to be connected to the operating voltage U2. A further island I5 with the transistors T2 of all circuits is also necessary. Two further islands I1 and I2 are required for the transistors TS1 and T4, and TS2 and T3, respectively.

If on the other hand the D/A converter is to operate in a differential mode, i.e. the supplied analog current is switched over between two separate outputs 16 and 16a, the connection of the collector of the transistor T1 to the operating voltage U2 is omitted. This embodiment is advantageous, for example, for applications with multipliers. In this case, the transistor T1 must necessarily be accommodated in a separate island I4, as shown in FIG. 4. It is again possible, however, to accommodate the transistors T1 of all circuits of the D/A converter in this island 14.

Figure 5:
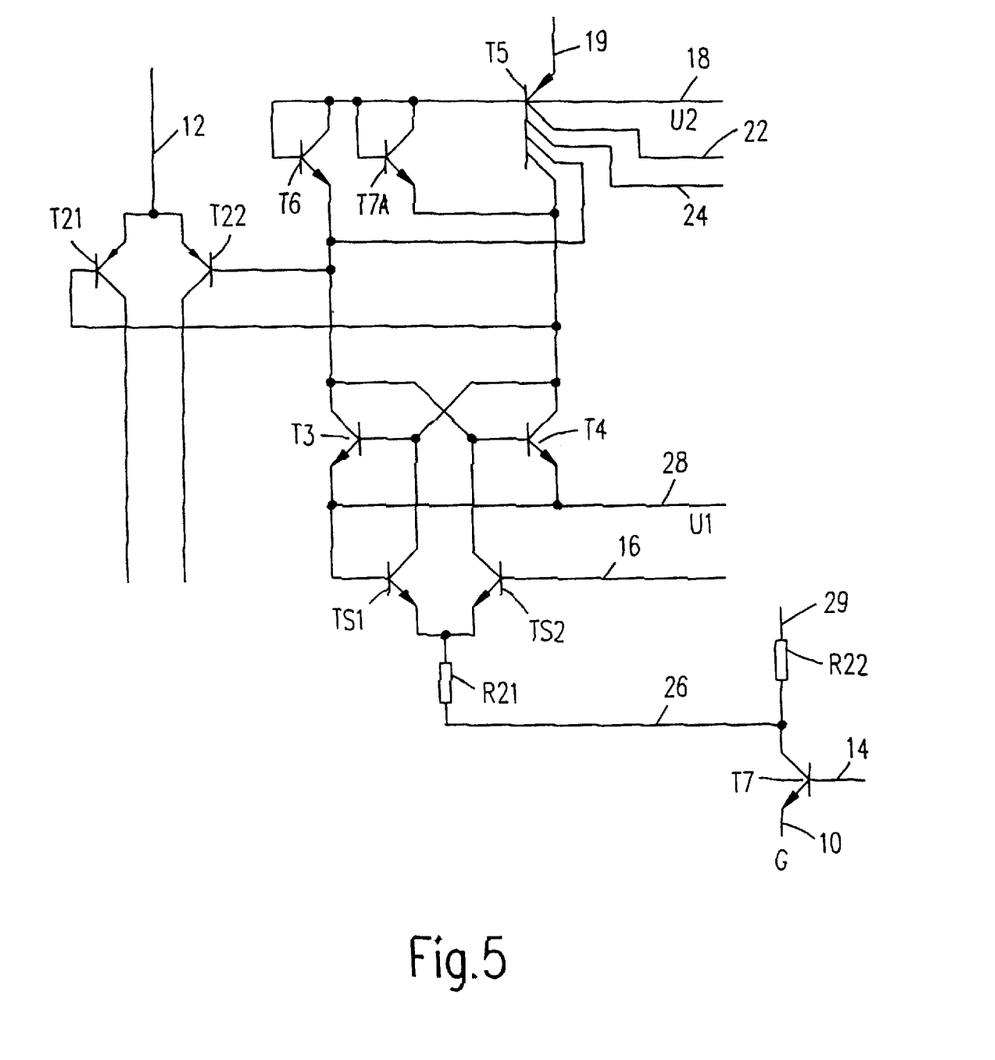
FIG. 5 shows a modification of the circuit arrangement of FIG. 3 in which the current switch transistors are of a conductivity type opposed to that of the transistors of the flipflop.

FIG. 5 shows a modification of the circuit of FIG. 3, where the current switch is realized by means of two PNP transistors T21 and T22 whose bases are again directly controlled by the collectors of the transistors T3 and T4. Assuming the reference voltage U1=1,5 V, and the saturation voltage of the transistors T3 and T4 is approximately 0 V, while also the minimum collector-base voltage Ucd of the transistors T21 and T22 is allowed to be 0 V, then the maximum collector voltage possible for the transistors T21 and T22 is substantially equal to U1, i.e. equal to 1,5 V. If higher values are to be possible, the reference voltage U1 and the operating voltage U2 as well as the maximum value of the data signal at the data input 16 must be correspondingly increased. It is possible in the layout of FIG. 4 to position the transistor T21 with the transistors T4 and TS1 as well as the transistor T22 with the transistors T3 and TS2 each in a common island, under certain conditions. The parasitic currents caused in the collectors of the transistors T21 and T22 by the transistors T3 and T4 should in that case be reduced by means of interposed p-type doped strips, and the remaining residual influence must lie within the accuracy requirements of the D/A converter.

Figure 6:
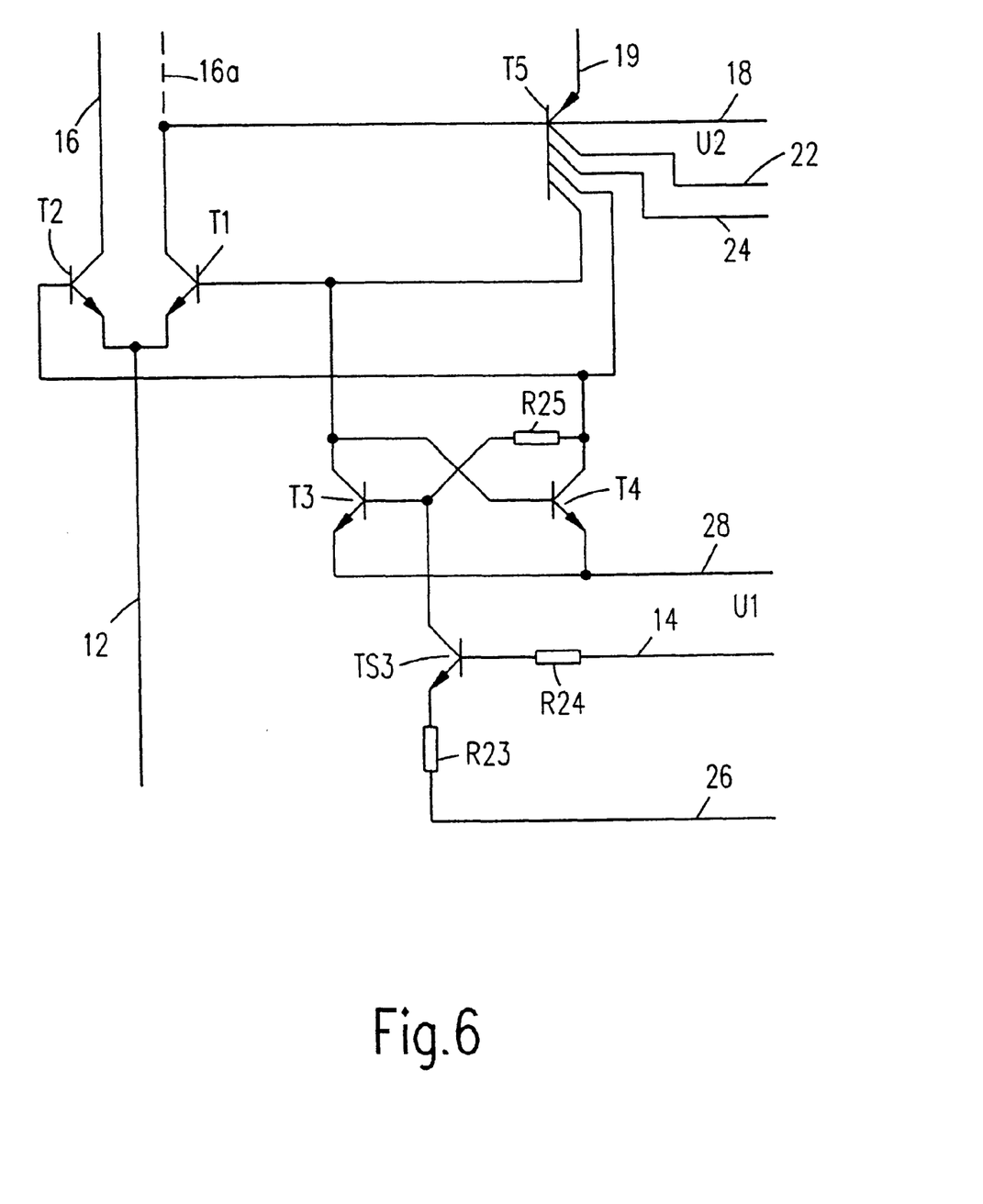
FIG. 6 shows a circuit arrangement with only one control transistor.

A further embodiment is shown in FIG. 6. Only one control transistor TS3 is present therein, whose base is controlled by the control line 14 via the resistor R24 and whose emitter is controlled by the data signal 16 via the resistor R23. Furthermore, a resistor R25 is included in the connection between the collector of the transistor T4 and the base of the transistor T3. On the other hand, the collectors of the transistors T3 and T4 are no longer connected via diodes to the operating voltage U2 on the line 18. This operating voltage U2 may accordingly be higher than the reference voltage U1 on the line 28 by more than the value Ube. This circuit operates as follows.

When the signal at the control input 14 is low, the transistor TS3 is cut off and does not influence the state of the flipflop. For the purpose of writing, the control input 14 receives a higher signal, for example 4 V or higher, assuming that the reference voltage U1 on the line has a value of 1.5 V. The current flow in the collector of the transistor TS3 now depends on the signal at the data input 16. When this signal is high, no current will flow through the resistor R23 and the emitter of the transistor TS3. The collector of the transistor TS3 has substantially the reference voltage U1 or is Ube higher than that, depending on the state of the flipflop, i.e. in all cases has a voltage lower than the emitter voltage and the base voltage of the transistor TS3. Assuming that the signal at the data input 16 is higher than the signal at the control input 14, the transistor TS3 will become inversely conducting. A current now flows from the collector of the transistor TS3 to the base of the transistor T3 and through the resistor R25. If the transistor T4 was previously conducting, the base voltage at the transistor T3 now increases to the extent that the latter becomes conducting and in its turn now switches the transistor T4 off. The flipflop is brought into a new state by this. The base of the transistor T3 now has a voltage of Ud=1.5 V+Ube, so that a voltage of 1.5 V+2Ube is applied to the base of the transistor TS3, i.e. approximately 3 V. The voltage at the control input 14 must be higher than 4 V then, so as to take into account temperature influences and tolerances, if still a sufficient current is to be achieved through the resistor R24. It should also be taken into account that, with the inversely conducting transistor TS3, part of the current flowing into the base will flow into the substrate. The remaining current flowing into the collector must then still be so strong that the transistor T3 can be driven into conduction. In a practical case, the current through the resistor R24 must be approximately six to ten times higher in this condition than the supply currents delivered by the collectors of the transistor T5.

The signal at the data input 16 is equal to zero for the other data value to be written. When the signal at the control input 14 is high in that case, a base current will flow through the resistor R24 into the transistor TS3, so that also an emitter current will flow through the resistor R23. This renders the transistor TS3 conducting in the substantially saturated state, and a current will flow through the resistor R25 into the collector of TS3, which causes the base of the transistor T3 to assume a lower voltage. If previously the transistor T3 was conducting, it will now be cut off thereby, and the transistor T4 will become conducting. This will bring the flipflop into a different state. When the signal at the control input 14 becomes low again, the transistor TS3 is cut off, and the state of the flipflop remains the same.

This embodiment has the advantage over the circuits of FIG. 3 and FIG. 5 that one component less is required, i.e. only one control transistor, and the operating voltage U2 on the line 18 may be freely chosen to have higher values. As a result, the transistor T5 may form part of a PNP bank, in which case the emitter is connected to a positive supply voltage. On the other hand, the layout realization is more costly in this way because the transistor TS3 must be accommodated in a separate island. The transistors R23 and R24 may be arranged in the island for the transistor T5 if a voltage is chosen for the operating voltage U2 on the line 18 which is higher than the maximum control signal on the line 14. This leads to a requirement for one island more than in the lay-out shown in FIG. 4. i.e. six islands, so that the advantage of the lower number of components is reduced again.

The transistors T1 and T2 for the current switch may again be constructed as PNP transistors in the circuit of FIG. 6.

We claim:

1. A circuit arrangement for a memory cell of a D/A converter with a data input, a control input, a current input which is connected to a current generator, a current switch comprising a first and a second transistor whose emitters are jointly coupled to the current input, a flipflop connected to an operating voltage and comprising a third and a fourth transistor whose bases and collectors are cross-coupled, whose collectors are furthermore coupled to the bases of the associated first and second transistor, respectively, and whose emitters are connected to a first reference voltage, characterized in that each collector of the third and the fourth transistors is directly connected to a respective base of the first and the second transistors and to a current source, in that the first reference voltage (G) lies between a second reference voltage (G) and the operating voltage (G) and differs from the second reference voltage (G) by at least a first differential voltage, and in that the data input (14) and the control input (14) are coupled at least to a first control transistor whose collector is directly connected to the base of at least the third or the fourth transistor.

2. A circuit arrangement as claimed in claim 1, characterized in that the current sources connected to the collectors of the third and the fourth transistor (T3, T4) are formed by the collectors of a fifth transistor (T5) which comprises several collectors and which has a conductivity type opposed to that of the third and the fourth transistor (T3, T4).

3. A circuit arrangement as claimed in claim 1, characterized in that a second control transistor (TS2) is provided, in that the collectors of the two control transistors (TS1, TS2) are each connected to a respective base of the third and the fourth transistor T3, T4), and the bases of the third and the fourth transistor (T3, T4) are directly connected to the collector of the respective other one of these transistors (T4, T3), in that the emitters of the first and the second control transistor (TS1, TS2) are coupled to one another and via a first resistor (R21) to the control input (14), and in that the base of one of the two control transistors (TS1) is coupled to the data input (16), and the base of the other one of the two control transistors (TS2) is connected to a third reference voltage (U1).

4. A circuit arrangement as claimed in claim 3, characterized in that the collectors of the third and the fourth transistor (T3, T4) are each connected to the operating voltage (U2) via a respective diode (T5, T6), and in that the operating voltage (U2) differs from the first reference voltage (U1) by a diode forward voltage.

5. A circuit arrangement as claimed in claim 4, characterized in that the base of the fifth transistor (T5) is connected to the operating voltage (U2).

6. A circuit arrangement as claimed in claim 1, characterized in that the base of the fourth transistor (T4) is directly connected to the collector of the third transistor (T3), and the base of the third transistor (3) is connected via a second resistor (R25) to the collector of the fourth transistor (T4) and to the collector of the control transistor (TS3) whose emitter is connected via a third resistor (R23) to the data input (16) and whose base is connected via a fourth resistor (R24) to the control input (14).

7. A D/A converter comprising several circuit arrangements as claimed in claim 2, characterized in that the fifth transistor (T5) comprises more than two collectors and is common to at least two circuit arrangements.

* * * * *